United States Patent
Mühe et al.

(10) Patent No.: US 7,179,331 B2
(45) Date of Patent: Feb. 20, 2007

(54) CRYSTAL GROWING EQUIPMENT

(75) Inventors: Andreas Mühe, Hanau (DE); Burkhard Altekrüger, Alzenau (DE); Axel Vonhoff, Friesenheim-Oberweier (DE)

(73) Assignee: Crystal Growing Systems GmbH, Asslar (DE)

( * ) Notice: Subject to any disclaimer, the term of this patent is extended or adjusted under 35 U.S.C. 154(b) by 67 days.

(21) Appl. No.: 10/921,560

(22) Filed: Aug. 19, 2004

(65) Prior Publication Data

US 2005/0087125 A1    Apr. 28, 2005

(30) Foreign Application Priority Data

Oct. 23, 2003 (DE) ................ 103 49 339

(51) Int. Cl.
*C30B 35/00* (2006.01)
(52) U.S. Cl. ............ 117/200; 117/30; 117/32; 117/900
(58) Field of Classification Search ............ 117/30, 117/32, 217, 917, 81, 83; 17/30
See application file for complete search history.

(56) References Cited

U.S. PATENT DOCUMENTS

| | | | |
|---|---|---|---|
| 5,009,865 A * | 4/1991 | Boden et al. | 117/200 |
| 5,196,085 A | 3/1993 | Szekely et al. | 156/617.1 |
| 5,571,320 A * | 11/1996 | Grimes et al. | 117/32 |
| 5,827,366 A * | 10/1998 | Watanabe | 117/202 |
| 5,968,233 A * | 10/1999 | Rouge et al. | 95/96 |
| 6,554,895 B2 * | 4/2003 | Duffar et al. | 117/82 |
| 2002/0092461 A1 | 7/2002 | Virbulis et al. | 117/13 |

FOREIGN PATENT DOCUMENTS

| | | |
|---|---|---|
| DE | 21 07 646 | 10/1971 |
| DE | 10102126 A1 | 6/1998 |
| DE | 19652543 A1 | 8/2002 |
| EP | 0 628 645 | 12/1994 |
| GB | 1347108 | 2/1974 |
| JP | 59121183 A | 7/1984 |

(Continued)

*Primary Examiner*—Felisa Hiteshew
(74) *Attorney, Agent, or Firm*—Needle & Rosenberg, P.C.

(57) ABSTRACT

The invention presented here relates to a crystal growing equipment. It is equipped in general with a resistance heater for heating a melt (13) as well as with field coils, which generate alternating magnetic field in a crucible, with which flows can be induced in the melt (13).

The invention is so designed that the resistance heaters are also devised to function as the field coils, that is, they are built of a hollow cylindrical body (1), in which, by means of a surrounding slit (2) which winds around it, a spiral-shaped single layer current path is formed. This has the advantage that the current needed for the electrical heating in the equipment is also used for the generation of the magnetic field. Thus, neither separate field coils nor a separate current supply is necessary. Further, the resistance heater, which serves as the field coil arranged as a coil array, is high temperature resistant and surrounds the immediate hot core zone of the equipment and thus the region of the melt. Thus the volume, in which the magnetic field must be generated, is minimized. Further, the alternating magnetic field does not need to penetrate through the wall of the vessel of the crystal growing equipment, hence the vessel can be designed as a steel boiler in conventional manner.

5 Claims, 3 Drawing Sheets

FOREIGN PATENT DOCUMENTS

| | | |
|---|---|---|
| JP | 60264391 | 12/1985 |
| JP | 60210592 | 3/1986 |
| JP | 01126293 | 5/1989 |
| JP | 03141187 | 9/1991 |
| JP | 06081086 | 3/1994 |

\* cited by examiner

CRYSTAL GROWING EQUIPMENT

This application claims priority benefit of German Application No. 103 49 339.5 filed Oct. 23, 2003, which is hereby incorporated by this reference in its entirety.

BACKGROUND OF THE INVENTION

Field of the Invention

The invention relates to a crystal growing equipment, in particular, to a semiconductor crystal growing equipment, with a heatable crucible for a melt and a coil array arranged coaxially with respect to the crucible, for generation of a magnetic field in the melt, whereby the coil array consists of three or more coils, which are set up one above the other in axial direction, and through each of the coil an alternating current flows with phase shift with respect to the neighboring coil.

In the growth of the semiconductor crystals from a melt, the flow of the molten mass, and the convective heat transport connected with it, play a critical role in regard to the resultant temperature distributions, form of the phase boundaries, and the related thermal stress in the growing crystal, and hence, ultimately, in the achievable quality of the crystal. Further, the temperature fluctuations at the phase boundary, which can occur due to the convection, can play a crucial role in the single crystal yield in the production process. Thus, the thermal convection leads, in the growing of silicon single crystals according to Czochralski method (CZ) for instance, in particular with increasing initial weight of the melt, to a turbulent flow of the molten mass, which is connected with pronounced temperature fluctuations. To solve this problem, use of static magnetic fields, which dampen the flow of the molten mass according to the principle of eddy current brake as well as time-dependent magnetic fields, which enable a controlled, forced convection, and counteract the turbulent buoyant convection, had been proposed and technically realized so far.

The use of time-dependent magnetic fields has, besides the possibility of suppressing free, turbulent convection, the advantage that even in the melt, which does not contain or has weakly manifest free convection, a targeted flow of the melt can be propelled. Thus, a stable stratification of the thermal layers in the growing of compound semiconductor crystals according to vertical-gradient-freeze method (VGF method) results in that the thermal buoyant convection practically does not occur and the heat transport in the melt is purely diffusive. In that case, the convection in the melt forced by the time-dependent magnetic fields can increase the effective heat transport and the temperature distribution in the layout of the growth, and thus, ultimately, can favorably influence the form of the phase boundary.

However, the systems hitherto have not been convincing in all points. In particular, the array of the resistance heat elements of the resistance heaters for heating the melt and the array of the coils for generation of the magnetic fields requires a lot of place. Furthermore, one must also consider this: the setup in the equipment, which operates according to the Vertical Gradient Freeze method (VGF), is fundamentally different from the equipment, which operates according to the Czochralski method (CZ). VGF method is operated under high pressure, hence the boiling vessel must be made of steel in order to withstand the high pressure. But a steel vessel would shield most of the magnetic field generated by the coil arrayed outside the vessel, so that in the interior of the melting crucible, which is made of boron nitride or quartz glass, inadequately strong traveling magnetic field for thorough mixing of the melt could be generated. That is, in the interior of the boiling vessel, the coil must be set up as near as possible to the crucible, but outside the crucible.

But, since the heating of the crucible is built within the interior of the boiler, the coil would cool the heating power of the heater at least partially. The coil cannot be set up within the crucible, because it would lead to chemical reactions with the melt or it would melt itself due to the high temperature of the melt or—at the time of cooling—it would hinder the melting of the silicon.

Hence the invention is based on the problem of finding a magnetic field configuration with simple means, which is suitable for steering the convection within the melt to such an extent that the crystal drawn out of the melt is as homogenous as possible, and thereby heats the melt.

To solve this problem, a device is so designed, according to the introductory clause of claim 1 of the invention, that the coils are made of a hollow cylindrical body of an electrically conducting material, which forms, by means of a slit that winds several times, a single layered, spiral-shaped, current path, which is subdivided in segments, each of which forms a coil, by the contact points that can be connected with the power supply.

Thus the idea behind the invention is to use a high temperature resistant coil, which need not be cooled. The next step of the invention is to combine the heater, which is required in any case, with the intended coil, such that the coil is shaped with a massive graphite conducting rods, which generate the correct magnetic field by adjusting the resistance and thus deliver the required heating power.

In case of Czochralski method, the processing is done in a crucible, made up of quartz glass, for instance, in a low pressure vacuum chamber with a glass guard. Here the use of heaters made of graphite built around the crucible is well-known. Thereby, the conductor rails arrayed in a meandering form, with a layout that results if a complete graphite cylinder, is alternatingly slitted from above to below and from below to above, and each time a web is left open for the cross linkage. Hereby, the currents going up and down mutually compensate the magnetic fields generated by each, so that no significant magnetic field is generated in the crucible.

Now, the inventive idea in case of CZ method is that the already familiar graphite heater is so to be redesigned that the conductor rail tracks pass through a spiral-shaped path surrounding the crucible, so that the direction of the current always remains same. In CZ method, the coil array, according to the idea of the invention, acts on the melt like a linear motor, whereby the direction of the motion of the outer zones of the melt are oriented upwards or downwards depending on the direction of the current. Here the skin effect can be exploited, so that with the increasing frequency of the rotary current, a thinner and thinner zone moves in the melt.

With this coils array, a traveling magnetic field can be generated, which penetrates into the semiconductor molten zone, and thereby generates a flow in the electrically conducting melt that is favorable for the crystal growing process. In particular, by varying the frequency of the alternating current as well as the phase shift, which on its part, is determined by the number of coils, a specific velocity can be adjusted, with which the magnetic field moves in the axial direction through the melt. However, the melt must be maintained at a specific temperature, which lies, as a rule, slightly above the melting point of the corresponding material to be melted. For that, the resistance heaters are arranged around the crucible. In addition to that, the coils can take over the function of the heating: the current passing through the coils generates heat as a result of its electric resistance, which serves both for the melting of the material in the crucible, as well as for the maintenance of the melting temperature.

Here the solution, according to the invention, has the special advantage that the hollow cylindrical body forms, due to its mostly closed internal area, excepting the thin slit, a particularly good source of thermal radiation because of its uniform radiation.

The electrically conducting coils are preferably connected with each other in star or delta connections, whereby the coils, depending on the array in the circuit, are connected with a pole of a source of the rotary current. Such sources of rotary current are in general available at the place of the installation of the crystal growing equipment itself, so that the power supply for the coil as required according to the invention is available without further expenditure.

In order to adjust the heating power independently of the time variations of the magnetic field, which alone determines the intensity of the induced current, the coils are additionally connected to a direct current source, which generates, in addition to the alternating current, a direct current in the coils, which alone is responsible for the heating power.

A hollow cylindrical body can easily be equipped with a spiral-shaped slit, if it runs a course along the hollow cylindrical body in the same directional sense.

In order that the coils can be supplied with power, there are segments which form the three coils, arranged one above another in axial direction, each with two points for contact with the phases of the rotary current source.

The contact points are connected with the electrically conducting rail tracks running along the internal and the external lateral surfaces of the hollow cylindrical body, which end at the connections at the end of the hollow cylindrical body, which are connected with the phases of the rotary current source. This has the advantage, that the connections of the crystal growing equipment are arranged at the bottom of the casing, and hence the isolation shell surrounding the coil or the resistance heater does not need any openings for the connections. This gives a very compact and a very well isolated equipment.

The rail tracks can also function as thermal resistance elements and for that they are connected with a source of direct current.

Considering all the components mentioned above, one obtains a device for electrical resistance heating of a semiconductor crystal growing equipment with simultaneous generation of a traveling magnetic field. In particular, the invention aims at an arrangement of electrical resistance elements in an array for growing single crystal semiconductor crystals from the melt, which is so designed that the alternating current flowing through the resistance elements also produces a magnetic field. Thus the invention consists essentially of a device for electric resistance heater of a semiconductor crystal growing equipment, which is characterized in that the resistance heater, with its essentially hollow cylindrical form, consists of three segments, arranged one above the other, in axial direction, in which the path of the current of a single layer coil is defined by the practically spiral-formed slit, and which has the same orientation as the spiral formed slit, and that the three segments above one another have each contacts for connection with the three phases of the rotary current source.

The double use of the coils, as a resistance heater and as a generator of the magnetic field, has the further advantage that, as in the hitherto used resistance heaters, which were used exclusively for the heating of the melt, they can be arranged in the boiler vessel in the immediate vicinity of the crucible. This is in contrast to the hitherto known setups, in which the field coils for the generation of the magnetic fields were arranged separately from the resistance heater outside the boiling vessel.

Hence, in devices for silicon crystal growing such as, for instance, those based on the Czochralski method, the boiler vessels made of quartz glass were used, which do not significantly shield the time-dependent magnetic fields generated by the coil array outside the boiling vessel. However these quartz glass vessels are extremely costly and cannot be fabricated with such diameters that are relevant in the crystal growing equipment under development at present. In case of such equipment for growing compound semiconductor crystals according to VOP method, the additional problem arises that boiler vessels with walls made of quartz glass do not come in question, because in the industrial production, the crystals are usually grown under high pressure conditions. On the other hand, the use of a common coil array, with copper wires for example, is not practicable in water-cooled vessel of the equipment due to thermal reasons.

Thus the invention solves the problem by using the electrical resistance heater, which surrounds the melt in the form of a hollow cylindrical body, with a slit structure on it, which forces the heating current to flow through a spiral-shaped track, so that the resistance heater also acts like a single layer coil for generation of the magnetic field. As the material for the resistance heater, graphite can be used with special advantage, because temperature resistance up to more than 2000° C. can be achieved with it. The use of cylindrical resistance heat elements made from isostatically pressed graphite is the standard practice today in the semiconductor crystal growing industry. In the processing of the resistance heaters with alternating current, a time-dependent alternating field is generated.

Thus the invention presented here has the advantage, that the current necessary for the electrical heating in the equipment is used at the same for the generation of the alternating mangetic field. With that, neither a separate field coil, nor a separate power supply for the field coil is necessary. Further the resistance heater, which is simultaneously designed as a coil array, is stable under high temperature and surrounds the immediate core zone in the equipment and hence the melt region. With that, the volume, within which the magnetic field must be generated, is minimized. Further, the alternating magnetic field need not penetrate through the boiler wall of the crystal growing equipment, so the boiler vessel can be designed as a steel boiler in the conventional manner. Furthermore, no screening problems arise in the region outside the equipment. In case of high pressure crystal growing equipment, the generation of the alternating magnetic fields in the melt zone is made possible at all by this invention. A further crucial advantage of the invention presented here is that the hollow cylindrical geometry of the heater-coil-setup corresponds to the heating arrangement most commonly used in crystal growing equipment and hence can be combined without requiring major constructive expense with the existing devices or even can be fitted afterwards, insofar as sufficient number of leadthroughs for current are available.

DESCRIPTION OF THE DRAWINGS

In the following, the invention is explained in detail by means of an illustrative design. Shown are.

DETAILED DESCRIPTION OF THE DRAWINGS

Figure 1:
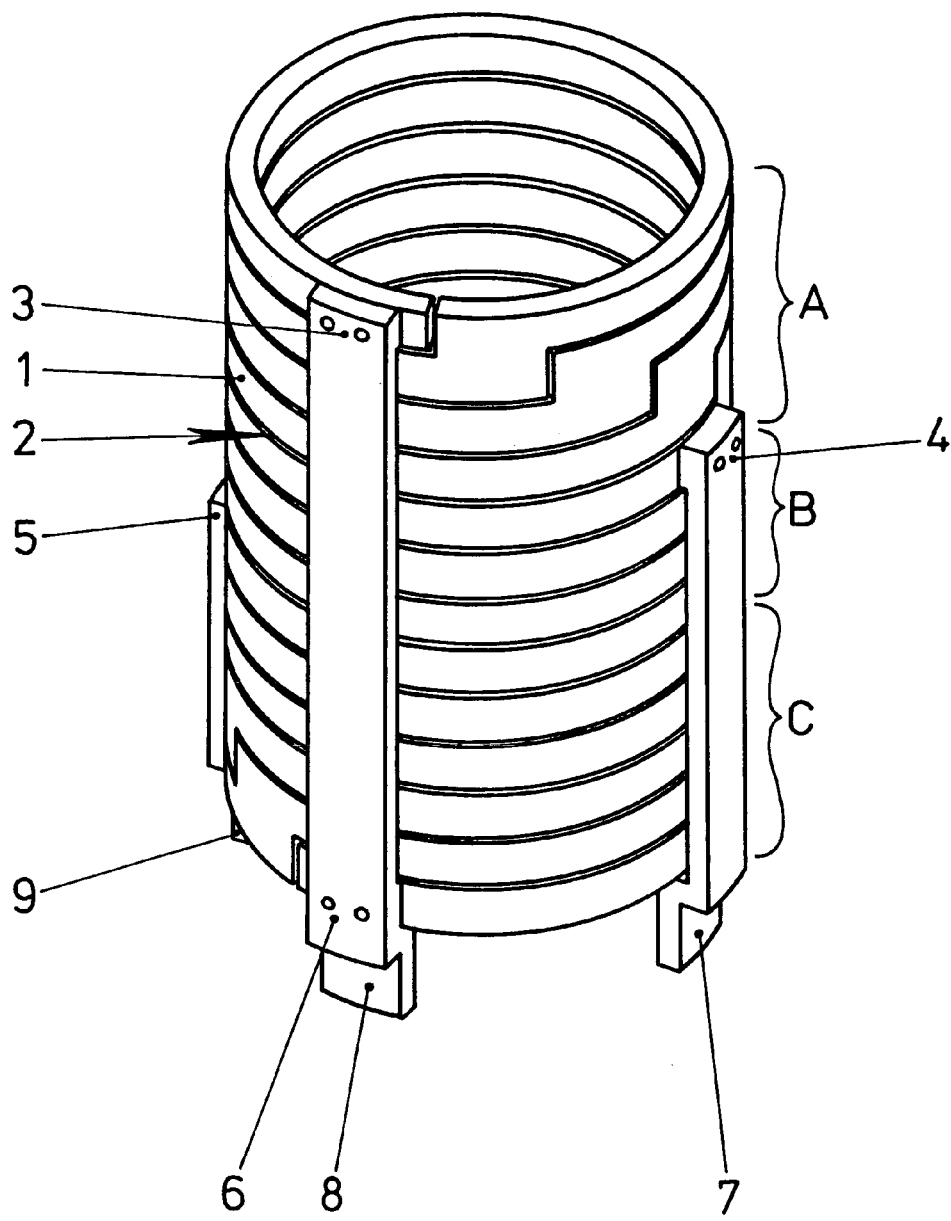
FIG. 1: The hollow cylindrical resistance heat element, with three segments in a surrounding spiral-shaped slit, each forming a magnetic field generating coil.

In FIG. 1, an example illustrating the heating coil array according to the invention is shown, in which a hollow cylindrical body 1, which can preferably be produced from isostatically pressed graphite, is provided with a practically spiral-shaped slit 2. The term "spiral-shaped" also includes the segmentwise course, as shown in FIG. 1. Furthermore, the array has four electrical contact points 3, 4, 5 and 6, which are used for feeding the alternating current. In the example shown in FIG. 1, the delta connection is realized by connecting the first phase of the rotary current source with the first rail track 8, stretching along the length of the hollow cylindrical body 1, to the first and the fourth contact points 3, 6 connected by it, the next phase connected to the second contact point 4 by means of a second track 7 and the third phase connected with the third contact point 5 by means of the third track 9. The tracks 7, 6, 9 can be screwed to the hollow cylindrical body 1 by means of high temperature resistant screws, which can be manufactured, for example, from coal fiber material CFC. To connect with the rotary current source, the tracks 7, 8, 9 can be screwed with the three current ducts at the base of the crystal growing equipment, to which the corresponding high current cables are clamped outside the system.

The spiral-shaped path of the current forming track is formed through the slit 2, which is subdivided at the contact points 3 to 6 into three segments, each of which forms a coil A, B, C. The tracks are taller than wider and therefore are essentially rectangular.

Figure 2:
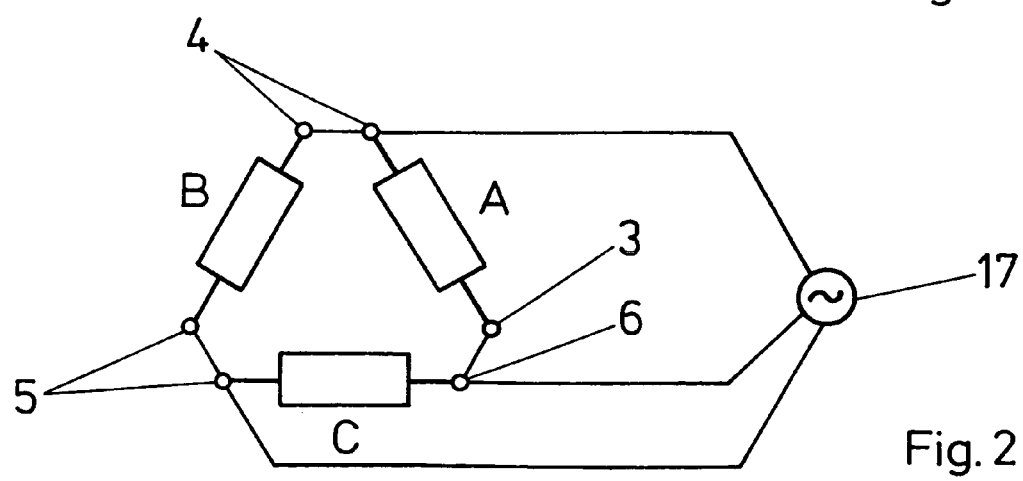
FIG. 2: The delta connection for the coils in FIG. 1.

FIG. 2 shows the circuitry of the three coils A, B, C in delta connection, in which the respectively adjacent ends of the (cyclic) neighboring coils are connected with each other and are connected to the phases of the rotary current source.

Further the resistance heating introduced in this invention comprises of three segments, arrayed one above the other in axial direction, each of which is defined by a pair of taps and which thus correspond to the three coils arrayed one above the other in axial direction. The taps can be configured as delta connections by means of the connections of the contact points 3 and 6, 4 and 4, 5 and 5—as shown in FIG. 1 and FIG. 2—and are connected to the three phases of the rotary current source. Alternatively, the three segments can be separated from each other at the points 4 and 5 and can be configured as a star connection and connected to the three phases of a rotary current source 17. In both cases, the three alternating currents, phase shifted by 120°, flow through the three segments, which generate traveling magnetic field in the device. This traveling field generates a current, directed upwards or downwards depending on the direction of the rotation of the connection of the three phases with the three sections, in the boundary region of the semiconductor melt situated within the resistance heater. This enables to counteract the thermal buoyant convection, such as, for example, in the case of the Czochralski equipment, whereas in the case of the VGF equipment, the effective heat transportation can be increased through the thorough mixing of the melt.

Figure 3:
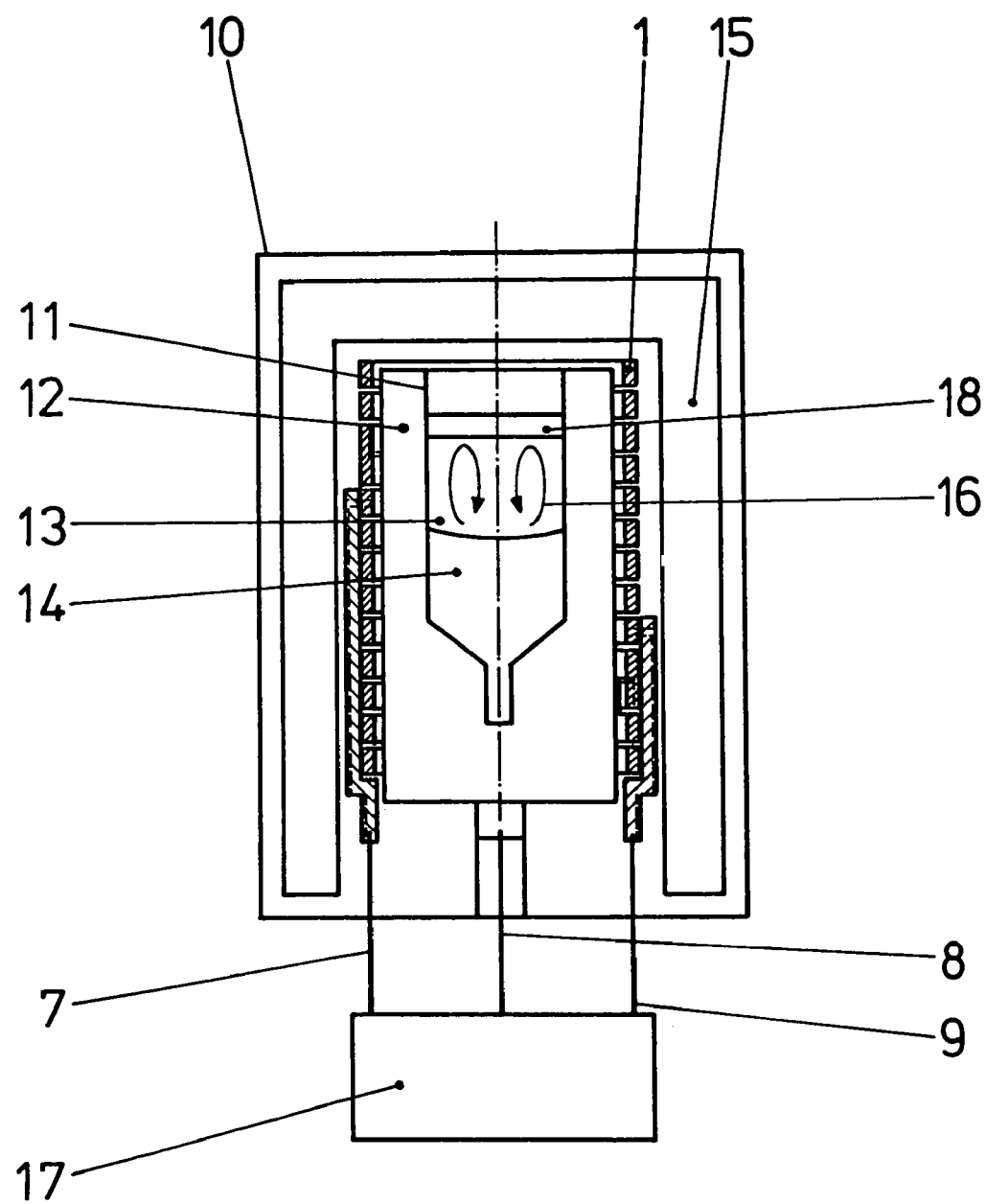
FIG. 3: The setup, according to the invention, of a resistance heater element in a VGF crystal growing equipment

In FIG. 3, the use of a heating coil array according to the invention, that is, of the hollow cylindrical body 1 as described above, is shown in a high pressure crystal growing equipment for growing compound semiconductor crystals according to the VGF process, which consists of a water cooled high pressure vessel 10 made from steel, in which, contained within the crucible 11, which is held within a supporting crucible 12, there is the melt, particularly a semiconductor melt, 13, from which the single crystal 14 grows. The high temperatures required for melting the semiconductor material are reached in the hollow cylindrical body 1 isolated with the thermal isolation pack 15, which is arranged radially outwards to the hollow cylindrical body. A typical flow pattern 16 in the semiconductor melt 13 is indicated by arrows, which is generated by the traveling magnetic field generated by the rotary current source 17 in combination with the hollow cylindrical body 1.

In the VGF crystal growing equipment for growing compound semiconductor crystals, the semiconductor melt 13 is typically covered with a bromide melt 18, which prevents volatilization of the volatile components of the compound semiconductor material due to the elevated pressure in the system.

Figure 4:
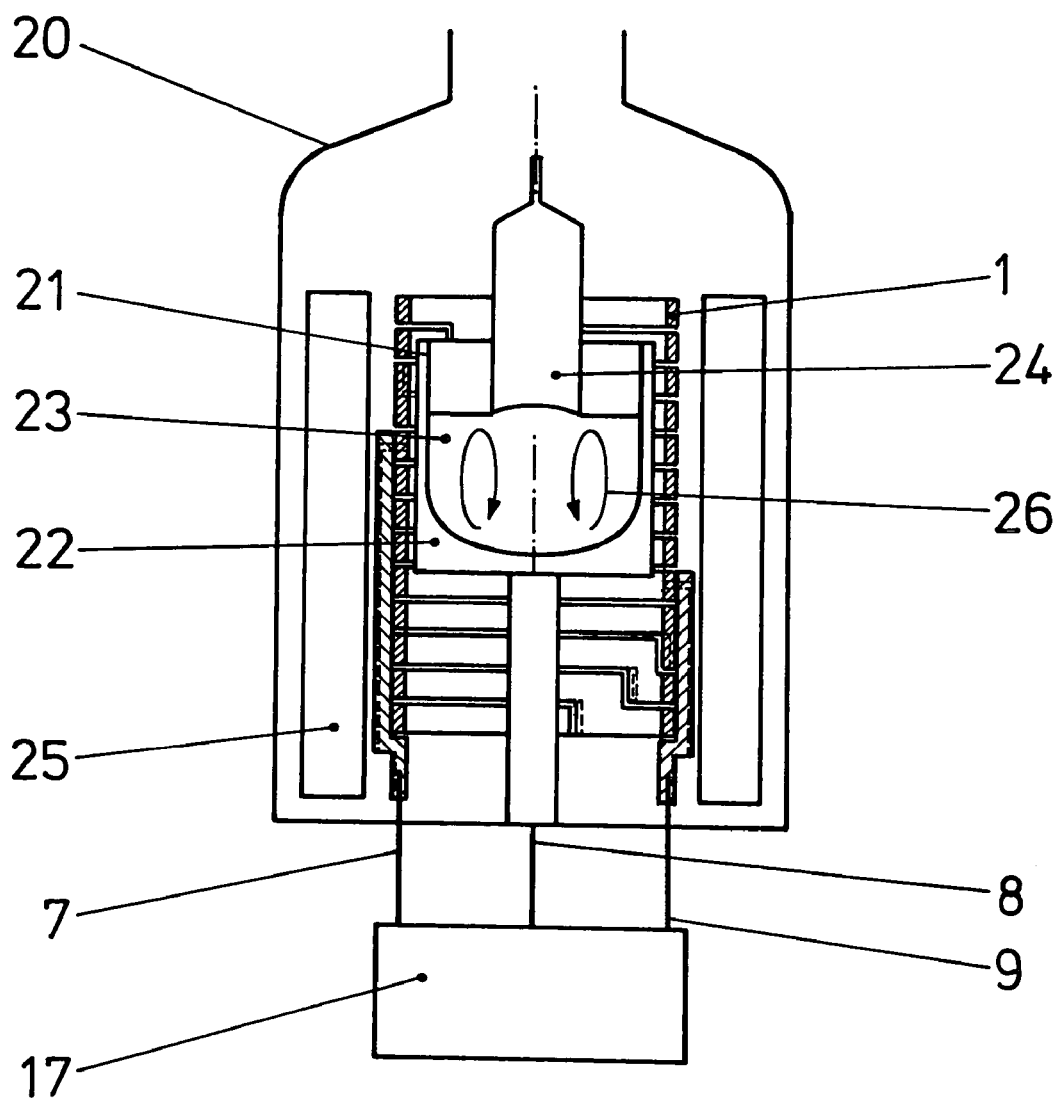
FIG. 4: The setup, according to the invention, of a resistance heater element in a crystal growing equipment according to CZ method.

In FIG. 4, the use of a hollow cylindrical body 1 according to the invention in a Czochralski equipment for growing silicon or germanium crystals is shown, which contains a water cooled steel vessel 20, in the interior of which there is a crucible 21 held by a support crucible 22, with the semiconductor melt 23 within 21. A single crystal is drawn from this semiconductor melt 23. The high temperatures required for melting the semiconductor material are attained using the hollow cylindrical body 1 in combination with the thermal isolation pack 25. A typical flow pattern 26 in the semiconductor melt 23 is indicated by the arrows, which is generated due to the thermal buoyant convection and which can be counteracted by the hollow cylindrical body 1 in combination with the traveling magnetic field generated by the rotary current source 17.

In principle the invention can be used in all equipment, in which electrically conductive melts are prepared by a resistance heating and in which a targeted influence on the flow of the melt is of technical importance. The invention can be used with particular advantage in all those systems, in which even today the cylindrical resistance heating elements are used in protective gas atmosphere under high pressure or under reduced pressure or in vacuum.

The invention claimed is:

1. A semiconductor crystal growing apparatus, comprising:
    a heatable crucible for a melt;
    a coil array arranged coaxially with respect to the crucible for generating a magnetic field in the melt, the coil array comprising at least three coils arranged axially one above another, wherein the coils comprise an electrically conductive material, and wherein each coil comprises an alternating current which is phase shifted from the alternating current of the adjacent coil to produce a traveling magnetic field inside the melt.

2. The crystal growing apparatus of claim 1, wherein the three coils form a unit and are electrically connected in the form of a star or a delta connection, whereby the coils are connected according to their circuit with the poles of the alternating current source.

3. The crystal growing apparatus of claim 1 or 2, wherein the coils are additionally connected to a direct current source.

4. The crystal growing apparatus of claim 1, wherein the individual coils are connected with each other in a star connection, and wherein a main track stretches along the length of the hollow cylindrical body in contact with all coils and connected with a direct current source.

5. The crystal growing apparatus of claim 1, wherein the hollow cylindrical body is arranged outside the crucible but within a vessel surrounding the crucible.

* * * * *